United States Patent
Jang et al.

(10) Patent No.: US 10,952,327 B2
(45) Date of Patent: Mar. 16, 2021

(54) SEMICONDUCTOR MODULE

(71) Applicant: SAMSUNG ELECTRONICS CO., LTD., Suwon-si (KR)

(72) Inventors: Jae-Seok Jang, Hwaseong-si (KR);
Dongmin Jang, Hwaseong-si (KR);
Geunje Park, Hwaseong-si (KR);
Jaekwang Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/254,907

(22) Filed: Jan. 23, 2019

(65) Prior Publication Data
US 2019/0335586 A1    Oct. 31, 2019

(30) Foreign Application Priority Data

Apr. 27, 2018  (KR) .......................... 10-2018-0049006
Aug. 21, 2018  (KR) .......................... 10-2018-0097116

(51) Int. Cl.
*H05K 7/00*     (2006.01)
*H05K 1/18*     (2006.01)
*H05K 1/11*     (2006.01)

(52) U.S. Cl.
CPC ............. *H05K 1/181* (2013.01); *H05K 1/117* (2013.01); *H05K 2201/1003* (2013.01);
(Continued)

(58) Field of Classification Search
CPC ................... H05K 1/181; H05K 1/117; H05K 2201/10015; H05K 2201/10022; H05K 2201/1003; H05K 2201/10159; H05K 2201/10515; H05K 2201/1053; H05K 2201/10545; H05K 2201/10636;
(Continued)

(56) References Cited

U.S. PATENT DOCUMENTS 4,727,513 A *  2/1988  Clayton .............. G06F 11/1032
                                                257/725
7,983,051 B2 *  7/2011  Lee .......................... G11C 5/00
                                                361/736
(Continued)

FOREIGN PATENT DOCUMENTS

KR    1020080005739    1/2008
KR    10-0809691       3/2008
(Continued)

OTHER PUBLICATIONS

Examination Report dated Oct. 8, 2019 from the European Patent Office in corresponding European Patent.

*Primary Examiner* — Yuriy Semenenko
(74) *Attorney, Agent, or Firm* — F. Chau & Associates, LLC

(57) ABSTRACT

A semiconductor module includes a module substrate having a first side extending in a first direction, a plurality of upper packages disposed on a top surface of the module substrate and arranged in rows extending in the first direction, and a passive element disposed on the top surface of the module substrate. At least a portion of the passive element overlaps one of the upper packages when viewed in a plan view, and the upper packages of a first row are arranged to be shifted with respect to the upper packages of a second row in the first direction.

18 Claims, 12 Drawing Sheets

(52) U.S. Cl.
CPC .............. *H05K 2201/10015* (2013.01); *H05K 2201/10022* (2013.01); *H05K 2201/1053* (2013.01); *H05K 2201/10159* (2013.01); *H05K 2201/10515* (2013.01); *H05K 2201/10545* (2013.01); *H05K 2201/10636* (2013.01); *H05K 2201/10734* (2013.01)

(58) Field of Classification Search
CPC .......... H05K 2201/10734; H05K 1/118; H01L 2924/19105; H01L 2224/16225; H01L 25/16; H01L 23/50; H01L 25/105
See application file for complete search history.

(56) References Cited

U.S. PATENT DOCUMENTS

| | | | |
|---|---|---|---|
| 8,060,774 B2* | 11/2011 | Smith | G06F 11/1076 |
| | | | 714/6.22 |
| 9,111,926 B2 | 8/2015 | Byun et al. | |
| 2006/0050497 A1* | 3/2006 | Goodwin | G11C 5/04 |
| | | | 361/803 |
| 2008/0023812 A1 | 1/2008 | Bang et al. | |
| 2011/0079672 A1 | 4/2011 | Kim et al. | |
| 2011/0079872 A1* | 4/2011 | Han | H05K 1/023 |
| | | | 257/528 |
| 2011/0090662 A1 | 4/2011 | Jang et al. | |
| 2011/0316119 A1 | 12/2011 | Kim et al. | |
| 2013/0015590 A1 | 1/2013 | Haba et al. | |
| 2013/0056882 A1* | 3/2013 | Kim | H01L 23/16 |
| | | | 257/777 |
| 2014/0252544 A1* | 9/2014 | Li | H01L 23/50 |
| | | | 257/532 |
| 2015/0078055 A1 | 3/2015 | Seok et al. | |
| 2015/0130041 A1 | 5/2015 | Seo et al. | |
| 2016/0037643 A1* | 2/2016 | Kim | H01L 25/0655 |
| | | | 361/767 |
| 2017/0030777 A1 | 2/2017 | Kimura et al. | |
| 2017/0179079 A1* | 6/2017 | Kim | H01L 23/50 |
| 2017/0188458 A1 | 6/2017 | Hsieh et al. | |
| 2017/0309606 A1 | 10/2017 | Lee et al. | |
| 2017/0358544 A1 | 12/2017 | Bae et al. | |

FOREIGN PATENT DOCUMENTS

| | | |
|---|---|---|
| KR | 1020080022192 | 3/2008 |
| KR | 1020110037402 | 4/2011 |
| KR | 1020110139983 | 12/2011 |
| KR | 1020130088924 | 8/2013 |
| KR | 1020150031963 | 3/2015 |
| KR | 1020150053484 | 5/2015 |
| KR | 1020070030518 | 3/2017 |
| KR | 1020170138644 | 12/2017 |

* cited by examiner

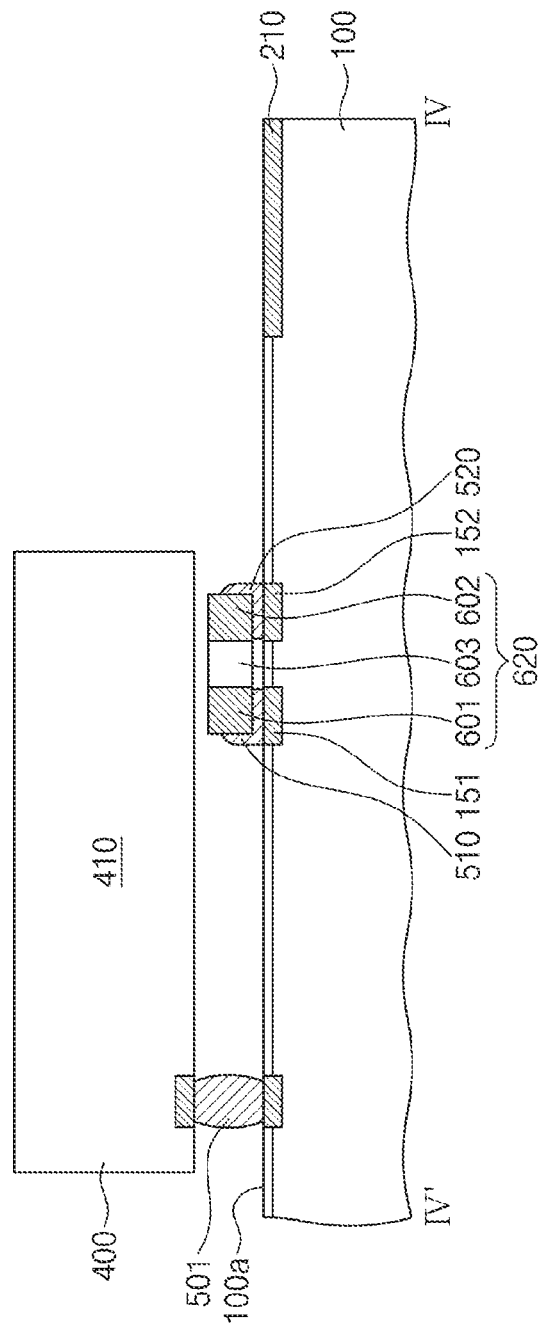

SEMICONDUCTOR MODULE

CROSS-REFERENCE TO RELATED APPLICATIONS

This application claims priority under 35 U.S.C. § 119 to Korean Patent Application No. 10-2018-0049006 filed on Apr. 27, 2018, and Korean Patent Application No. 10-2018-0097116 filed on Aug. 21, 2018, the disclosures of which are hereby incorporated by reference in their entireties.

TECHNICAL FIELD

Exemplary embodiments of the present inventive concept relate to a semiconductor module and, more particularly, to a semiconductor module including memory packages.

DISCUSSION OF THE RELATED ART

As demand for high-capacity electronic products such as, for example, smartphones and notebook computers has been increasing, demand for high-capacity semiconductor modules used in such electronic products has also been increasing to satisfy the demand. Relatedly, sizes of semiconductor packages disposed on such high-capacity semiconductor modules have also been increasing to realize the high-capacity semiconductor modules. Thus, sizes of the semiconductor modules may be increased and lengths of signal lines in the semiconductor modules may also be increased.

SUMMARY

Exemplary embodiments of the present inventive concept may provide a semiconductor module capable of improving operating speed and reliability.

According to an exemplary embodiment of the present inventive concept, a semiconductor module includes a module substrate having a first side extending in a first direction, a plurality of upper packages disposed on a top surface of the module substrate and arranged in a plurality of rows extending in the first direction, and a passive element disposed on the top surface of the module substrate. At least a portion of the passive element overlaps one of the upper packages when viewed in a plan view, and the upper packages of a first row belonging to the plurality of rows are arranged to be shifted with respect to the upper packages of a second row belonging to the plurality of rows in the first direction.

According to an exemplary embodiment of the present inventive concept, a semiconductor module includes a module substrate having a first side, a second side opposite to the first side, a third side adjacent to the first side, and a fourth side opposite to the third side, a plurality of tabs disposed on a top surface of the module substrate adjacent to the first side, a plurality of memory packages mounted on the top surface of the module substrate and arranged in a plurality of rows extending in a first direction, and a passive element mounted on the top surface of the module substrate. The first side of the module substrate extends in the first direction, and at least a portion of the passive element overlaps one of the memory packages when viewed in a plan view. The memory packages include a plurality of first packages disposed in a first row belonging to the plurality of rows in the plan view, and a plurality of second packages disposed in a second row belonging to the plurality of rows in the plan view. The second packages are closer to the tabs than the first packages. A minimum distance between the third side and the first packages is less than a minimum distance between the third side and the second packages, and a minimum distance between the fourth side and the first packages is less than a minimum distance between the fourth side and the second packages.

According to an exemplary embodiment of the present inventive concept, a semiconductor module includes a module substrate having a first side extending in a first direction and a second side extending in the first direction, a plurality of tabs disposed on a top surface of the module substrate adjacent to the first side, a plurality of memory packages mounted on the top surface of the module substrate and arranged in a plurality of rows extending in the first direction, and a passive element mounted on the top surface of the module substrate. At least a portion of the passive element overlaps one of the memory packages when viewed in a plan view. The memory packages include a plurality of first packages disposed in a first row belonging to the plurality of rows in the plan view, and a plurality of second packages disposed in a second row belonging to the plurality of rows in the plan view. The second packages are closer to the tabs than the first packages. Each of the first packages has a long axis parallel to a second direction that is substantially perpendicular to the first direction, and each of the second packages has a long axis parallel to the first direction.

BRIEF DESCRIPTION OF THE DRAWINGS

The above and other features of the present inventive concept will become more apparent by describing in detail exemplary embodiments thereof with reference to the accompanying drawings, in which:

FIG. 1F is a cross-sectional view taken along line IV-IV' of FIG. 1D.

DETAILED DESCRIPTION OF THE EXEMPLARY EMBODIMENTS

Figure 1A:
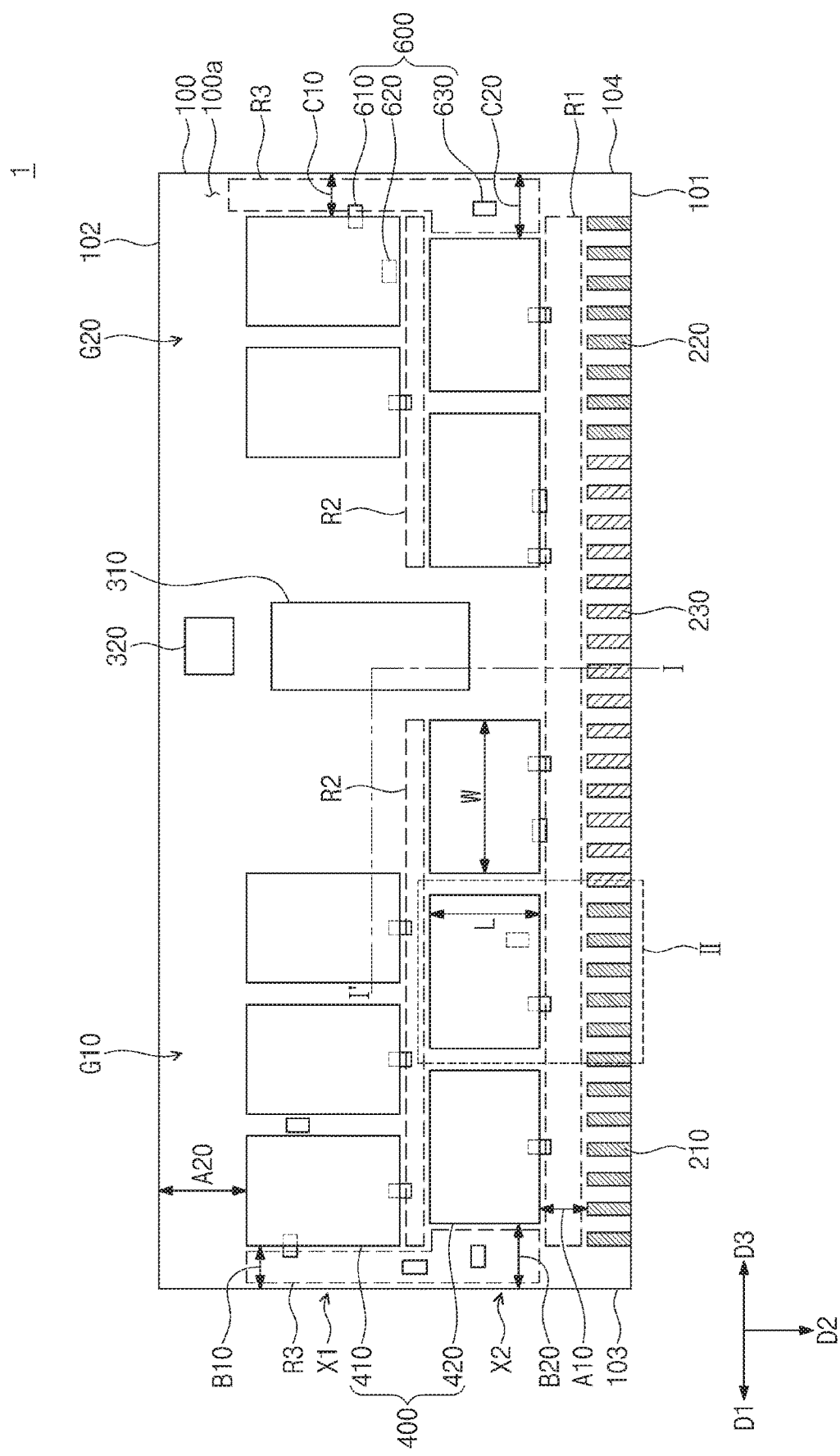
FIG. 1A is a top view illustrating a top surface of a semiconductor module according to exemplary embodiments of the present inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

As used herein, the singular forms "a", "an" and "the" are intended to include the plural forms as well, unless the context clearly indicates otherwise.

Figure 1B:
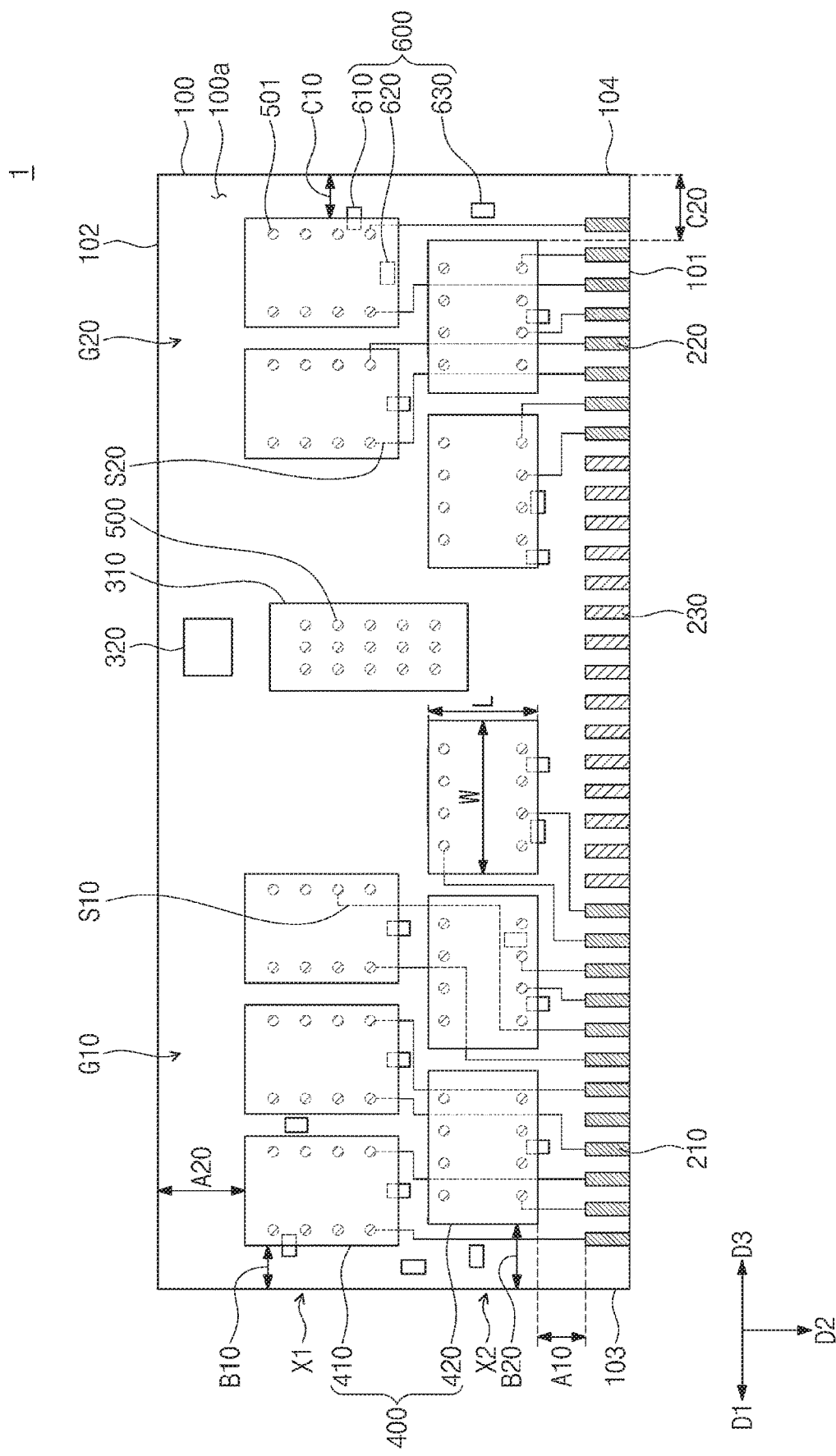
FIG. 1B is a top view illustrating electrical connections between upper tabs and upper packages of the semiconductor module of FIG. 1A.
Figure 1C:
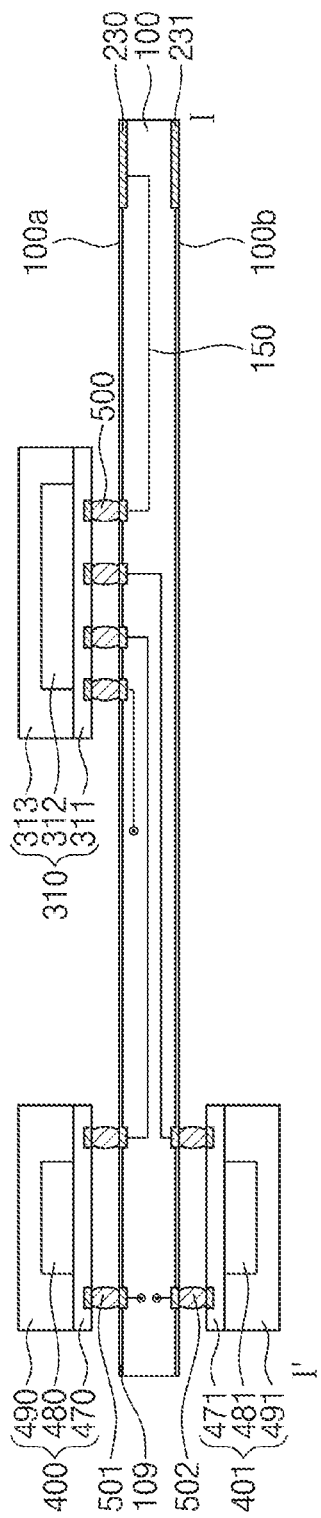
FIG. 1C is a cross-sectional view taken along line I-I' of FIG. 1A.
Figure 1D:
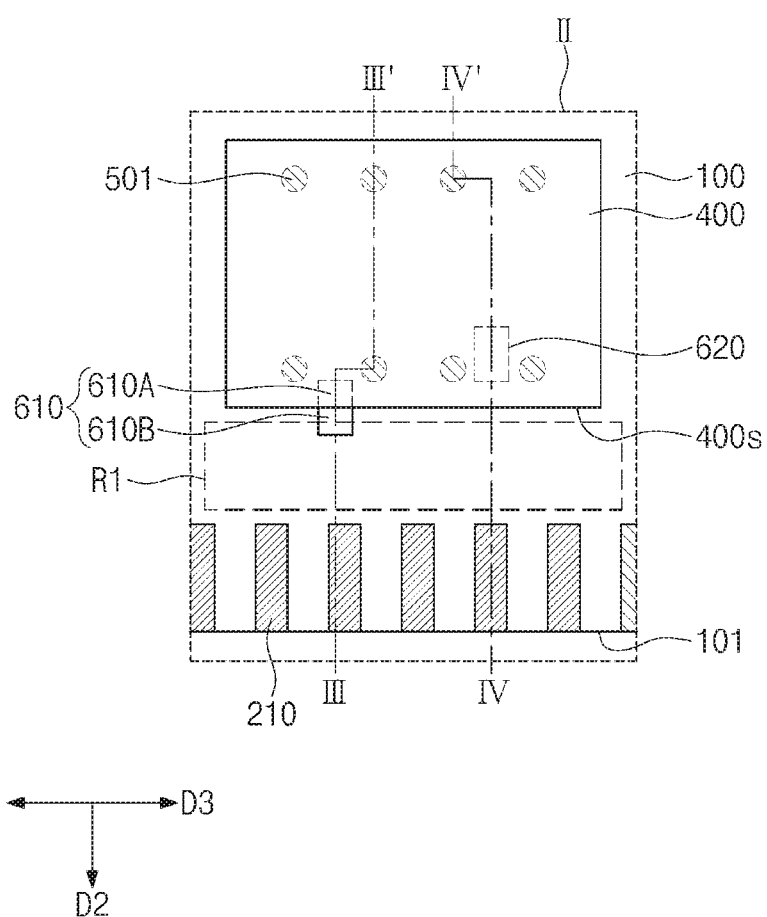
FIG. 1D is an enlarged view of region 'II' of FIG. 1A.
Figure 1E:
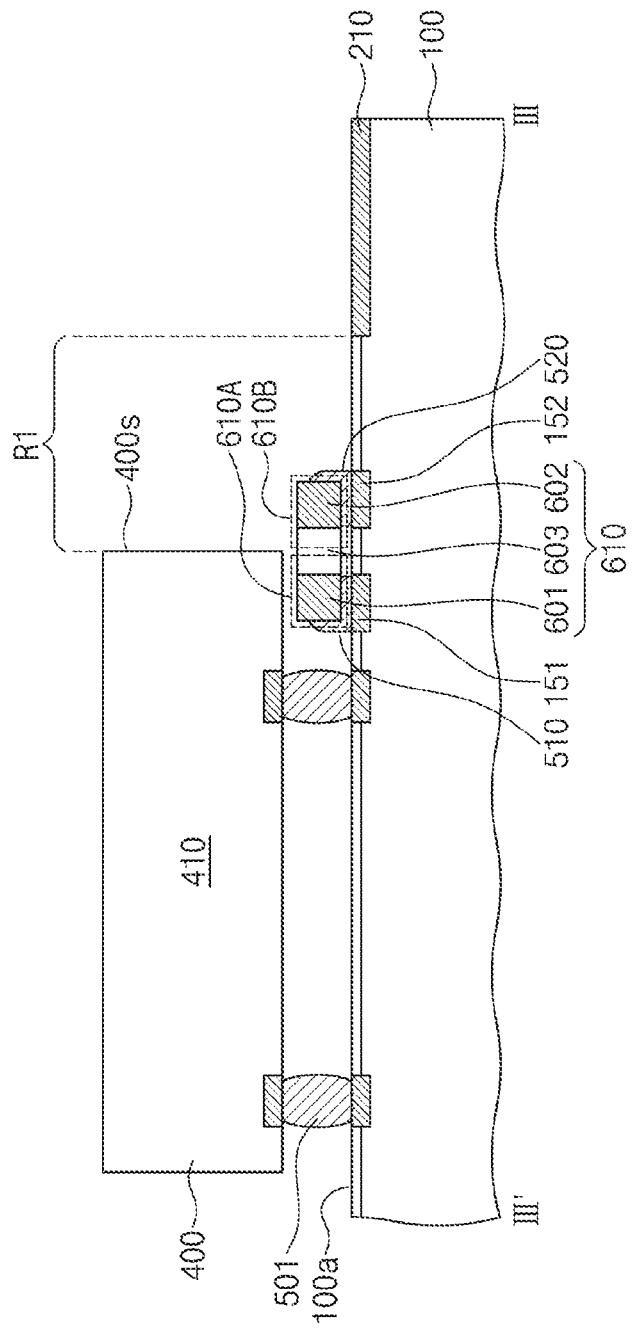
FIG. 1E is a cross-sectional view taken along line III-III' of FIG. 1D.
Figure 1G:
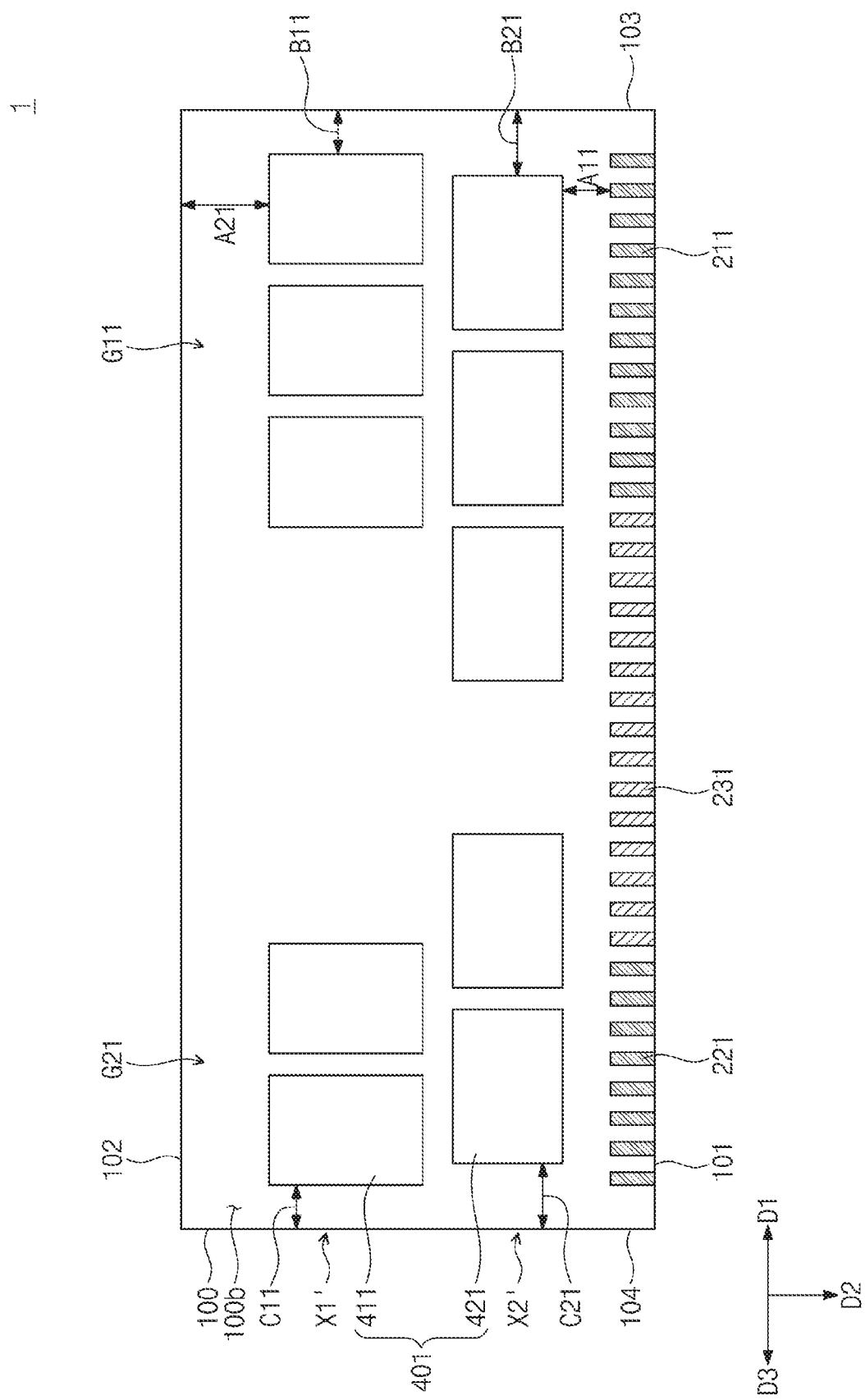
FIG. 1G is a bottom view illustrating a bottom surface of the semiconductor module of FIG. 1A.
Figure 1H:
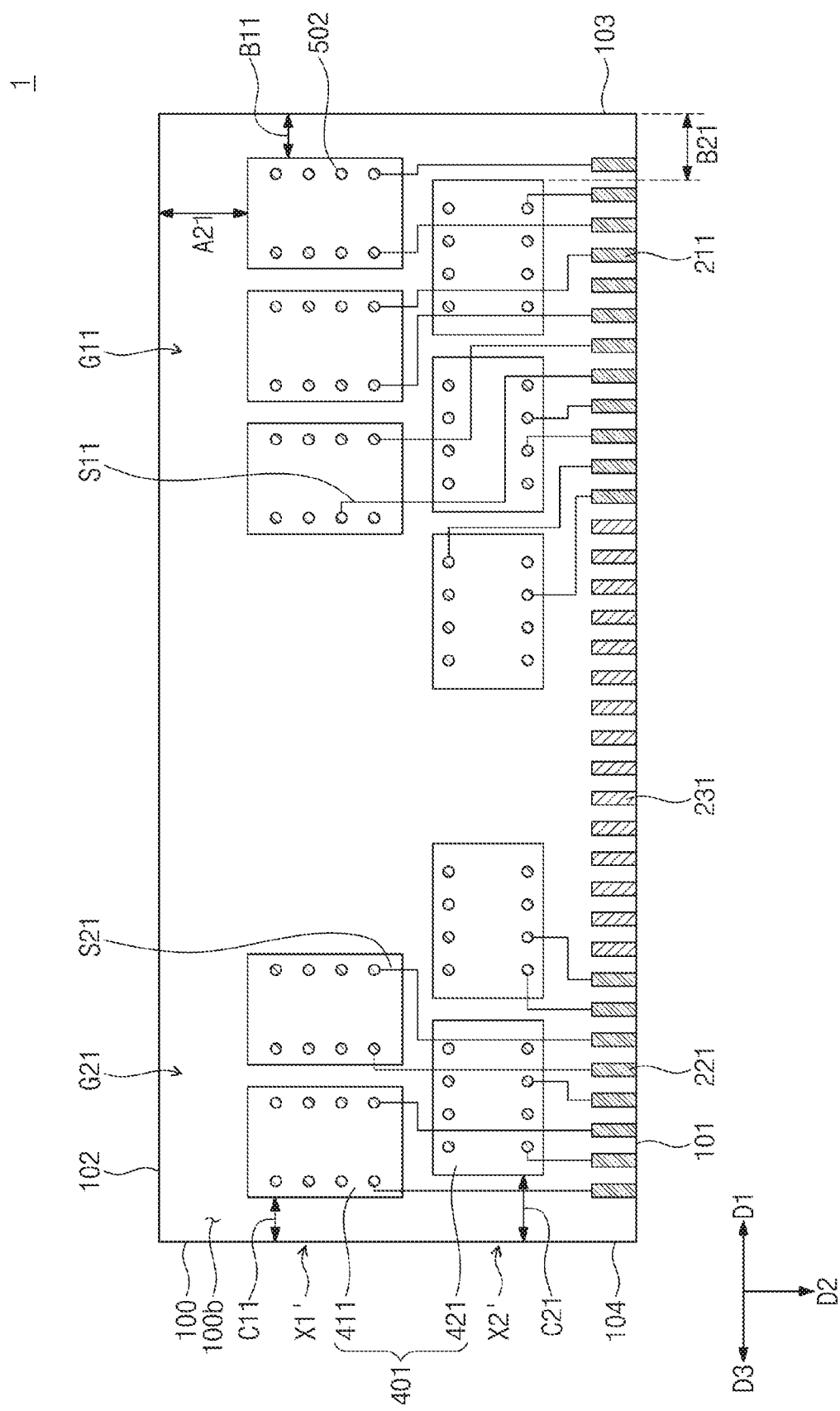
FIG. 1H is a bottom view illustrating electrical connections between lower tabs and lower packages.

FIG. 1A is a top view illustrating a top surface of a semiconductor module according to exemplary embodiments of the present inventive concept. FIG. 1B is a top view illustrating electrical connections between upper tabs and upper packages of the semiconductor module of FIG. 1A. FIG. 1C is a cross-sectional view taken along line I-I' of FIG. 1A. FIG. 1D is an enlarged view of region 'II' of FIG. 1A. FIG. 1E is a cross-sectional view taken along line III-III' of FIG. 1D. FIG. 1F is a cross-sectional view taken along line IV-IV' of FIG. 1D. FIG. 1G is a bottom view illustrating a bottom surface of the semiconductor module of FIG. 1A. FIG. 1H is a bottom view illustrating electrical connections between lower tabs and lower packages.

Referring to FIGS. 1A to 1H, a semiconductor module 1 may include a module substrate 100, upper tabs 210, 220 and 230, a semiconductor package 310, a semiconductor device 320, upper packages 400, a passive element 600, lower tabs 211, 221 and 231, and lower packages 401. The upper tabs 210, 220 and 230, and the lower tabs 211, 221 and 231, may also be referred to herein as contact terminals.

The module substrate 100 may be a printed circuit board (PCB) having a circuit pattern. The module substrate 100 may have a top surface 100a and a bottom surface 100b, which are opposite to each other. The module substrate 100 may have a first side 101, a second side 102, a third side 103, and a fourth side 104. The first side 101 and the second side 102 of the module substrate 100 may be opposite to each other, and may extend in a first direction D1. The first direction D1 may be substantially parallel to the top surface 100a of the module substrate 100, and a second direction D2 may be substantially parallel to the top surface 100a of the module substrate 100 and substantially perpendicular to the first direction D1. A third direction D3 may be substantially parallel to the top surface 100a of the module substrate 100 and may indicate an opposite direction to the first direction D1. The third side 103 of the module substrate 100 may neighbor the first side 101 and the second side 102, the third side 103 and the fourth side 104 of the module substrate 100 may be opposite to each other, and the third side 103 and the fourth side 104 of the module substrate 100 may extend in the second direction D2.

The upper tabs 210, 220 and 230 may be disposed on the top surface 100a of the module substrate 100. The upper tabs 210, 220 and 230 may be disposed adjacent to the first side 101 of the module substrate 100. The upper tabs 210, 220 and 230 may be aligned and arranged in the first direction D1, thus forming a row that extends in the first direction D1. Each of the upper tabs 210, 220 and 230 may have a long axis substantially parallel to the second direction D2 when viewed in a plan view. For example, each of the upper tabs 210, 220 and 230 may extend lengthwise in the second direction D2. The upper tabs 210, 220 and 230 may include a metal such as, for example, copper or aluminum. As illustrated in FIG. 1C, the upper tabs 210, 220 and 230 may be portions of conductive patterns of the module substrate 100, which are exposed by a passivation layer 109. However, exemplary embodiments of the present inventive concept are not limited thereto.

The upper tabs 210, 220 and 230 may include first upper tabs 210, second upper tabs 220, and a third upper tab 230. Functions and arrangement of the upper tabs 210, 220 and 230 may be standardized. For example, the functions and the arrangement of the upper tabs 210, 220 and 230 may satisfy the Joint Electron Device Engineering Council (JEDEC) standard. The first upper tabs 210 may be closer to the third side 103 of the module substrate 100 than the second and third upper tabs 220 and 230. The second upper tabs 220 may be closer to the fourth side 104 of the module substrate 100 than the third upper tab 230. The first and second upper tabs 210 and 220 may function as input/output terminals of data signals. The third upper tab 230 may be disposed between the first upper tabs 210 and the second upper tabs 220 when viewed in a plan view. The third upper tab 230 may function as a transmission path of a command/address (C/A) signal.

The semiconductor package 310 may be mounted on the top surface 100a of the module substrate 100. The semiconductor package 310 may be disposed in a central region of the top surface 100a of the module substrate 100 when viewed in a plan view. The semiconductor package 310 may function as a logic package or a buffer package. As illustrated in FIG. 1C, the semiconductor package 310 may include a first package substrate 311, a first semiconductor chip 312, and a first molding pattern 313. The first package substrate 311 may be, for example, a PCB or a redistribution layer. The first semiconductor chip 312 may be mounted on the first package substrate 311. The first semiconductor chip 312 may include logic circuits and may function as at least one of, for example, a logic chip or a buffer chip. The first molding pattern 313 may be disposed on the first package substrate 311 and may seal the first semiconductor chip 312. At least one connection terminal 500 may be disposed between the module substrate 100 and the first package substrate 311, and may connect the module substrate 100 and the semiconductor package 310. The connection terminal 500 may include at least one of, for example, a pillar, a bump, or a solder ball. The connection terminal 500 may include a conductive material. The first semiconductor chip 312 may be electrically connected to interconnection lines 150 in the module substrate 100 through the first package substrate 311 and the connection terminals 500. The interconnection lines 150 may include conductive patterns and vias.

The semiconductor package 310 may be electrically connected to the third upper tab 230 through the interconnection lines 150 in the module substrate 100. Thus, the command/address signal may be transmitted between the third upper tab 230 and the first semiconductor chip 312. The semiconductor package 310 may be electrically connected to the upper packages 400 and the lower packages 401 through the interconnection lines 150 in the module substrate 100. The semiconductor package 310 may control the upper packages 400 and the lower packages 401. Herein, it is understood that when an element or component is electrically connected to the module substrate 100, it may be electrically connected to the interconnection lines 150 in the module substrate 100. The interconnection lines 150 are schematically illustrated in FIG. 1C. It is to be understood that the arrangement and shapes of the interconnection lines 150 may be variously modified. For convenience of illustration, the interconnection lines 150 are omitted in figures other than FIG. 1C.

The semiconductor device 320 may be mounted on the top surface 100a of the module substrate 100. The semiconductor device 320 may be spaced apart from the semiconductor package 310 when viewed in a plan view. The semiconductor device 320 may include, for example, a serial presence detection (SPD) chip. For example, information relating to the semiconductor module 1 may be stored in the SPD chip of the semiconductor device 320. The information relating to the semiconductor module 1 may include, for example, information indicating the type of memories of the semiconductor module 1 and/or timing of access to the memories. In exemplary embodiments, the SPD chip may be used as the semiconductor device 320. In this case, the SPD chip may be mounted directly on the top surface 100a of the module substrate 100. In exemplary embodiments, a package including the SPD chip may be used as the semiconductor device 320. In this case, the semiconductor device 320 may include a second package substrate, the SPD chip mounted on the second package substrate, and a second molding pattern covering the SPD chip on the second package substrate. The semiconductor device 320 may be electrically connected to the semiconductor package 310 through the module substrate 100.

The upper packages 400 may be mounted on the top surface 100a of the module substrate 100. The upper packages 400 may be spaced apart from the semiconductor package 310, the semiconductor device 320, and the upper tabs 210, 220 and 230. The upper packages 400 may be spaced apart from one another. Each of the upper packages 400 may be a memory package. The upper packages 400 may be the same as one another. For example, the upper packages 400 may have the same planar area, the same shape, and the same storage capacity as one another. Each of the upper packages 400 may include an upper substrate 470, an upper semiconductor chip 480, and an upper molding layer 490. The upper semiconductor chip 480 may be a memory chip. For example, the upper semiconductor chip 480 may include a dynamic random access memory (DRAM), a static random access memory (SRAM), a synchronous dynamic random access memory (SDRAM), or a magnetic random access memory (MRAM). The upper semiconductor chip 480 may be mounted on the upper substrate 470. The upper molding layer 490 may be disposed on the upper substrate 470 and may cover the upper semiconductor chip 480. Upper connection terminals 501 may be disposed between the module substrate 100 and the upper packages 400. Each of the upper connection terminals 501 may include at least one of, for example, a pillar, a bump, or a solder ball. The upper packages 400 may be electrically connected to the module substrate 100 through the upper connection terminals 501.

As illustrated in FIGS. 1A and 1B, the upper packages 400 may be arranged along a plurality of rows X1 and X2. Each of the rows X1 and X2 may extend in the first direction D1. Each of the rows X1 and X2 may include a plurality of the upper packages 400. In FIG. 1B, solid lines between the upper connection terminals 501 and the first and second upper tabs 210 and 220 schematically represent electrical connections between the upper packages 400 and the first and second upper tabs 210 and 220. The upper packages 400 may transmit/receive signals to/from an external system or device through the module substrate 100 and the first and second upper tabs 210 and 220. Signals between the upper packages 400 and the first and second upper tabs 210 and 220 may be data (DQ) signals. As lengths of signal paths between the upper packages 400 and the first and second upper tabs 210 and 220 decrease, the operating speed and reliability of the semiconductor module 1 may be improved. High-capacity memory packages may be used as the upper packages 400.

In exemplary embodiments, the upper packages 400 may be shifted in the second direction D2. For example, in exemplary embodiments, the upper packages 400 may be disposed such that a minimum distance A10 between the upper packages 400 and the upper tabs 210, 220 and 230 may be less than a minimum distance A20 between the upper packages 400 and the second side 102 of the module substrate 100. Thus, the lengths of the signal paths between the upper packages 400 and the first and second upper tabs 210 and 220 may be reduced.

The upper packages 400 may include first packages 410 and second packages 420. The first packages 410 may correspond to upper packages 400 disposed in a first row X1, and the second packages 420 may correspond to upper packages 400 disposed in a second row X2. The second packages 420 may be closer to the first side 101 of the module substrate 100 and the upper tabs 210, 220 and 230 than the first packages 410. The number of the second packages 420 may be equal to the number of the first packages 410. However, exemplary embodiments of the present inventive concept are not limited thereto. Each of the second packages 420 may have a long axis substantially parallel to the first direction D1. For example, a width W of each of the second packages 420 may be greater than a length L of each of the second packages 420. Thus, lengths of signal paths between the second packages 420 and the first and second upper tabs 210 and 220 may be further reduced. Herein, a width of a component may refer to a distance between both ends of the component in the first direction D1, and a length of the component may refer to a distance between both ends of the component in the second direction D2.

Some of the upper packages 400 may constitute a first group G10, and others of the upper packages 400 may constitute a second group G20. The upper packages 400 of the first group G10 may be disposed between the semiconductor package 310 and the third side 103 of the module substrate 100 when viewed in a plan view. As illustrated in FIG. 1B, the upper packages 400 of the first group G10 may be electrically connected to the first upper tabs 210 through the module substrate 100. In exemplary embodiments, the upper packages 400 of the first group G10 are not electrically connected to the second and third upper tabs 220 and 230. Referring to the upper packages 400 of the first group G10, a length of a signal path S10 (see FIG. 1B) between the first package 410 closest to the fourth side 104 of the module substrate 100 and the first upper tab 210 connected thereto may correspond to a maximum signal path length.

In exemplary embodiments, referring to the upper packages 400 of the first group G10, the first packages 410 may be shifted with respect to the second packages 420 in the first direction D1. For example, in exemplary embodiments, the upper packages 400 may be disposed such that a minimum distance B10 between the third side 103 of the module substrate 100 and the first packages 410 may be less than a minimum distance B20 between the third side 103 of the module substrate 100 and the second packages 420.

Herein, when some upper packages 400 are described as being shifted with respect to other upper packages 400 in a certain direction, it is to be understood that the some upper packages 400 and the other upper packages 400 may be arranged such that the some upper packages 400 and the other upper packages 400 are not aligned with each other in the certain direction. For example, referring to FIGS. 1A and 1B, in exemplary embodiments, first packages 410 disposed in the first row X1 and second packages 420 disposed in the second row X2 are not aligned with each other in the first direction D1. For example, boundaries of the first packages 410 disposed in the first row X1 are not aligned with boundaries of the second packages 420 disposed in the second row X2.

Further, in exemplary embodiments, the first packages 410 and the second packages 420 are misaligned such that the distance between the first package 410 closest to the third side 103 of the module substrate 100 and the third side 103 is different from the distance between the second package 420 closest to the third side 103 of the module substrate 100 and the third side 103. For example, as shown in FIGS. 1A and 1B, in exemplary embodiments, the minimum distance B10 between the third side 103 of the module substrate 100 and the closest first package 410 may be less than the minimum distance B20 between the third side 103 of the module substrate 100 and the closest second package 420.

Although the orientations of the first packages 410 disposed in the first row X1 and the second packages 420 disposed in the second row X2 in FIGS. 1A and 1B are different, exemplary embodiments are not limited thereto. For example, in exemplary embodiments, the first packages 410 disposed in the first row X1 and the second packages 420 disposed in the second row X2 may be disposed in the same orientation and are not aligned with one another.

Referring to the upper packages 400 of the first group G10, the number of the first packages 410 may be equal to the number of the second packages 420. Still referring to the upper packages 400 of the first group G10, in exemplary embodiments, the upper packages 400 may be disposed such that a maximum distance between the third side 103 of the module substrate 100 and the first packages 410 may be less than a maximum distance between the third side 103 of the module substrate 100 and the second packages 420. Thus, according to exemplary embodiments, the length of the signal path S10 between the first package 410 closest to the fourth side 104 of the module substrate 100 and the first upper tab 210 connected thereto may be reduced. As a result, the maximum signal path length between the first upper tabs 210 and the upper packages 400 of the first group G10 may be reduced according to exemplary embodiments.

In exemplary embodiments, the first packages 410 are misaligned with respect to the second packages 420 in the second direction D2 in the first group G10, and the first packages 410 are misaligned with respect to the second packages 420 in the second direction D2 in the second group G20.

The upper packages 400 of the second group G20 may be disposed between the semiconductor package 310 and the fourth side 104 of the module substrate 100 when viewed in a plan view. The upper packages 400 of the second group G20 may be electrically connected to the second upper tabs 220 through the module substrate 100. In exemplary embodiments, the upper packages 400 of the second group G20 are not electrically connected to the first and third upper tabs 210 and 230. Referring to the upper packages 400 of the second group G20, a length of a signal path S20 (see FIG. 1B) between the first package 410 closest to the third side 103 of the module substrate 100 and the second upper tab 220 connected thereto may correspond to a maximum signal path length. In exemplary embodiments, referring to the upper packages 400 of the second group G20, the first packages 410 may be shifted with respect to the second packages 420 in the third direction D3. For example, in exemplary embodiments, the upper packages 400 may be disposed such that a minimum distance C10 between the fourth side 104 of the module substrate 100 and the first packages 410 of the second group G20 may be less than a minimum distance C20 between the fourth side 104 of the module substrate 100 and the second packages 420 of the second group G20. Referring to the upper packages 400 of the second group G20, the number of the first packages 410 may be equal to the number of the second packages 420. Still referring to the upper packages 400 of the second group G20, in exemplary embodiments, the upper packages 400 may be disposed such that a maximum distance between the fourth side 104 of the module substrate 100 and the first packages 410 may be less than a maximum distance between the fourth side 104 of the module substrate 100 and the second packages 420. Thus, the maximum signal path length between the second upper tabs 220 and the upper packages 400 of the second group G20 may be reduced according to exemplary embodiments.

As illustrated in FIG. 1A, the module substrate 100 may include a first region R1, second regions R2, and third regions R3. The first region R1 of the module substrate 100 may be disposed between the first packages 410 and the upper tabs 210, 220 and 230. The second regions R2 of the module substrate 100 may be disposed between the first packages 410 and the second packages 420. One of the third regions R3 of the module substrate 100 may be disposed between the third side 103 of the module substrate 100 and an outermost one of the first packages 410 of the first group G10, and between the third side 103 of the module substrate 100 and an outermost one of the second packages 420 of the first group G10. Another one of the third regions R3 of the module substrate 100 may be disposed between the fourth side 104 of the module substrate 100 and an outermost one of the first packages 410 of the second group G20, and between the fourth side 104 of the module substrate 100 and an outermost one of the second packages 420 of the second group G20.

The passive element 600 may be mounted on the top surface 100a of the module substrate 100. The passive element 600 may include, for example, at least one of a resistor, a capacitor, or an inductor. The passive element 600 may be disposed in plurality, and at least one of the passive elements 600 may overlap with one of the upper packages 400 when viewed in a plan view. The passive elements 600 may include a first passive element 610, a second passive element 620, and a third passive element 630. Arrangement of the passive elements 600 and the upper packages 400 will be described hereinafter. For convenience of explanation and illustration, a singular upper package will be described with reference to FIGS. 1D, 1E and 1F.

As illustrated in FIGS. 1A, 1D and 1E, the first passive element 610 may include a first portion 610A and a second portion 610B, which are connected to each other. In exemplary embodiments, the first portion 610A of the first passive element 610 overlaps one of the upper packages 400 when viewed in a plan view, and the second portion 610B of the first passive element 610 does not overlap the upper package 400. In exemplary embodiments, the second portion 610B of the first passive element 610 may overlap the first region R1 of the module substrate 100 when viewed in a plan view (see FIG. 1D). In exemplary embodiments, as illustrated in FIG. 1A, the second portion 610B of the first passive element 610 overlaps the second region R2 of the module substrate 100 when viewed in a plan view. In exemplary embodiments, the second portion 610B of the first passive element 610 overlaps the third region R3 of the module substrate 100 when viewed in a plan view. As illustrated in FIGS. 1D and 1F, in exemplary embodiments, the second passive element 620 may completely overlap the upper package 400 when viewed in a plan view. For example, as shown in FIG. 1D, in exemplary embodiments, the first passive element 610 partially overlaps the upper package 400 and the second passive element 620 completely overlaps the upper package 400 when viewed in a plan view. According to exemplary embodiments, the upper packages 400 may overlap the first and second passive elements 610 and 620 when viewed in a plan view, and thus, a size of the semiconductor module 1 may be reduced.

According to exemplary embodiments of the present inventive concept, since the upper packages 400 overlap the first and second passive elements 610 and 620 in a plan view, the upper packages 400 are not limited by the arrangement and positions of the first and second passive elements 610 and 620, but rather, may be freely disposed regardless of the arrangement and positions of the first and second passive elements 610 and 620. For example, since the upper package 400 overlaps the first and second passive elements 610 and 620, the upper package 400 may be further shifted in the second direction D2. In this case, the second portion 610B of the first passive element 610 may overlap the first region R1 or the second region R2 when viewed in a plan view. Since the upper package 400 overlaps the first and second passive elements 610 and 620, the first packages 410 may be further shifted with respect to the second packages 420 in the first direction D1 in the first group G10. In the second group G20, the first packages 410 may be further shifted with respect to the second packages 420 in the third direction D3. In this case, the second portion 610B of the first passive element 610 may overlap the third region R3 when viewed in a plan view. Thus, the lengths of the signal paths between the upper packages 400 and the first and second upper tabs 210 and 220 may be reduced to improve electrical characteristics of the semiconductor module 1.

The first and second passive elements 610 and 620 may be disposed in a gap between the module substrate 100 and the upper package 400, as illustrated in FIGS. 1E and 1F. Top surfaces of the first and second passive elements 610 and 620 may be disposed at the same level as or a lower level than a bottom surface of the upper package 400. The first and second passive elements 610 and 620 may be spaced apart from the upper connection terminals 501. Thus, an electrical short may be prevented from occurring between the upper connection terminals 501 and the first and second passive elements 610 and 620.

External force may be applied onto the upper package 400. For example, an external force may be applied onto the upper package 400 during a process of manufacturing the semiconductor module 1, a process of transferring the semiconductor module 1, and/or a process of operating the semiconductor module 1. An edge portion of the upper package 400 may be bent by the external force. If the edge portion of the upper package 400 is excessively bent, the upper package 400 may be damaged. However, according to exemplary embodiments of the present inventive concept, the first passive element 610 and/or the second passive element 620 may overlap the edge portion of the upper package 400 when viewed in a plan view. For example, the first passive element 610 may be disposed between a bottom surface of the edge portion of the upper package 400 and the top surface 100a of the module substrate 100. Thus, the upper package 400 may be prevented from being excessively bent in exemplary embodiments.

As shown in FIGS. 1E and 1F, a first pad 151 and a second pad 152 may be disposed on the top surface 100a of the module substrate 100. The first and second pads 151 and 152 may include, for example, a conductive material such as a metal. In exemplary embodiments, each of the first and second passive elements 610 and 620 may include a first electrode 601 and a second electrode 602, which are spaced apart from each other. The second electrode 602 may be electrically isolated from the first electrode 601. An insulator 603 may be disposed between the first electrode 601 and the second electrode 602. However, the structure and the components of the passive element 600 are not limited thereto, and may be variously modified. A first connection portion 510 may be disposed between the first electrode 601 and the first pad 151. The first electrode 601 may be electrically connected to the module substrate 100 through the first connection portion 510. A second connection portion 520 may be disposed between the second electrode 602 and the second pad 152. The second electrode 602 may be electrically connected to the module substrate 100 through the second connection portion 520.

The first connection portion 510, the second connection portion 520 and the upper connection terminal 501 may include, for example, a solder material. The solder material may include, for example, at least one of tin, silver, gold, or bismuth. In exemplary embodiments, formation of the first connection portion 510 may include providing a solder material between the first pad 151 and the first electrode 601, and soldering the solder material. Formation of the second connection portion 520 may include providing a solder material between the second pad 152 and the second electrode 602, and soldering the solder material. Formation of the upper connection terminal 501 may include providing a solder material between the module substrate 100 and the upper package 400, and soldering the solder material. The first connection portion 510, the second connection portion 520 and the upper connection terminal 501 may be formed using a single soldering process. The soldering process may be performed by thermal treatment. In the soldering process, the first electrode 601 and/or the second electrode 602 may be excessively spaced apart from the module substrate 100 by tension between the solder material and the electrodes 601 and 602. In this case, formation of the first connection portion 510 and/or the second connection portion 520 may be difficult.

However, according to exemplary embodiments of the present inventive concept, the bottom surface of the upper package 400 may be disposed on the first passive element 610. In a process of mounting the first passive element 610, the upper package 400 may prevent the first electrode 601 and/or the second electrode 602 of the first passive element 610 from being excessively spaced apart from the module substrate 100. Thus, the first connection portion 510 and the second connection portion 520 may be sufficiently connected to the first electrode 601 and the second electrode 602, respectively. Similarly, the upper package 400 may be disposed on a top surface of the second passive element 620. As a result, the first electrode 601 and/or the second electrode 602 of the second passive element 620 may be prevented from being excessively spaced apart from the module substrate 100.

Referring again to FIG. 1A, in exemplary embodiments, the third passive element 630 does not overlap the upper packages 400, but rather, is spaced apart from the upper packages 400 when viewed in a plan view. The third passive element 630 may be disposed in one of the first region R1, the second regions R2 and the third regions R3 of the module substrate 100. Alternatively, the third passive element 630 may be disposed between the first packages 410 when viewed in a plan view. In exemplary embodiments, the third passive element 630 may be omitted. In exemplary embodiments, one of the first and second passive elements 610 and 620 may be omitted.

The lower tabs 211, 221 and 231 may be disposed on the bottom surface 100b of the module substrate 100, as illustrated in FIGS. 1G and 1H. As illustrated in FIG. 1C, the lower tabs 211, 221 and 231 may be portions of conductive patterns of the module substrate 100, which are exposed by the passivation layer 109 disposed on the bottom surface 100b. However, exemplary embodiments of the present inventive concept are not limited thereto. The lower tabs 211, 221 and 231 may include a metal. The planar arrangement of the lower tabs 211, 221 and 231 may correspond to the planar arrangement of the upper tabs 210, 220 and 230. For example, the lower tabs 211, 221 and 231 may be adjacent to the first side 101 of the module substrate 100. The lower tabs 211, 221 and 231 may be spaced apart from one another and may be electrically isolated from one another. The lower tabs 211, 221 and 231 may include first lower tabs 211, second lower tabs 221, and a third lower tab 231. The first lower tabs 211 may be closer to the third side 103 of the module substrate 100 than the second and third lower tabs 221 and 231. The second lower tabs 221 may be closer to the fourth side 104 of the module substrate 100 than the third lower tab 231. The first and second lower tabs 211 and 221 may function as input/output terminals of data signals of the lower packages 401. The third lower tab 231 may be disposed between the first lower tabs 211 and the second lower tabs 221. The third lower tab 231 may function as a transmission path of a command/address signal.

Each of the lower packages 401 may be a memory package. For example, the lower packages 401 may have the same size, the same shape, and the same storage capacity as one another. In exemplary embodiments, the lower packages 401 may have the same size, the same shape and the same storage capacity as the upper packages 400. Each of the lower packages 401 may include a lower substrate 471, a lower semiconductor chip 481, and a lower molding layer 491, as illustrated in FIG. 1C. The lower semiconductor chip 481 may be a memory chip. The lower semiconductor chip 481 may be mounted on the lower substrate 471. The type of the lower semiconductor chip 481 may be the same as the type of the upper semiconductor chip 480. However, exemplary embodiments of the present inventive concept are not limited thereto. The lower molding layer 491 may be disposed on the lower substrate 471 and may cover the lower semiconductor chip 481. Lower connection terminals 502 may be disposed between the module substrate 100 and the lower packages 401. The lower packages 401 may be electrically connected to the module substrate 100 through the lower connection terminals 502.

The lower packages 401 may be spaced apart from the lower tabs 211, 221 and 231. The planar arrangement of the lower packages 401 may correspond to the planar arrangement of the upper packages 400. For example, as illustrated in FIGS. 1G and 1H, the lower packages 401 may be arranged along a plurality of rows X1' and X2'. Each of the rows X1' and X2' may extend in the first direction D1. Each of the rows X1' and X2' may include a plurality of the lower packages 401. For example, the row X1' may include upper packages 411, and the row X2' may include upper packages 421 (see FIGS. 1G and 1H). The number of the lower packages 401 in a second row X2' may be equal to the number of the lower packages 401 in a first row X1'. The lower packages 401 may transmit/receive signals to/from an external system or device through the first and second lower tabs 211 and 221. As lengths of signal paths between the lower packages 401 and the first and second lower tabs 211 and 221 decrease, the operating speed and reliability of the semiconductor module 1 may be improved. Signals between the lower packages 401 and the first and second lower tabs 211 and 221 may be data (DQ) signals. In exemplary embodiments, the lower packages 401 may be shifted in the second direction D2. For example, in exemplary embodiments, the lower packages 401 may be disposed such that a minimum distance A11 between the lower packages 401 and the lower tabs 211, 221 and 231 may be less than a minimum distance A21 between the lower packages 401 and the second side 102 of the module substrate 100. Thus, the lengths of the signal paths between the lower packages 401 and the first and second lower tabs 211 and 221 may be reduced.

The lower packages 401 of the second row X2' may be closer to the lower tabs 211, 221 and 231 than the lower packages 401 of the first row X1'. Each of the lower packages 401 of the second row X2' may have a long axis substantially parallel to the first direction D1. For example, a width of each of the lower packages 401 of the second row X2' may be greater than a length of each of the lower packages 401 of the second row X2'. Thus, the lower packages 401 may be closer to the lower tabs 211, 221 and 231. As a result, the lengths of the signal paths between the lower packages 401 and the first and second lower tabs 211 and 221 may be reduced. Each of the lower packages 401 of the first row X1' may have a long axis substantially parallel to the second direction D2. For example, each of the lower packages 401 of the first row X1' may extend lengthwise in the second direction D2.

Thus, in exemplary embodiments, the orientation of each of the lower packages 401 of the second row X2' may be different than the orientation of each of the lower packages 401 of the first row X1'.

Some of the lower packages 401 may constitute a first group G11, and others of the lower packages 401 may constitute a second group G21. The lower packages 401 of the first group G11 may be closer to the third side 103 of the module substrate 100 than to the fourth side 104 of the module substrate 100 when viewed in a plan view. In FIG. 1H, solid lines between the lower connection terminals 502 and the first and second lower tabs 211 and 221 schematically represent electrical connections between the lower packages 401 and the first and second lower tabs 211 and 221. In exemplary embodiments, the lower packages 401 of the first group G11 may be electrically connected to the first lower tabs 211 through the module substrate 100, and the lower packages 401 of the first group G11 are not electrically connected to the second and third lower tabs 221 and 231.

In the lower packages 401 of the first group G11, a length of a signal path S11 (see FIG. 1H) between the lower package 401 of the first row X1' closest to the fourth side 104 and the first lower tab 211 connected thereto may correspond to a maximum signal path length. In exemplary embodiments, in the lower packages 401 of the first group G11, the lower packages 401 of the first row X1' may be shifted with respect to the lower packages 401 of the second row X2' in the first direction D1. For example, a minimum distance B11 between the third side 103 of the module substrate 100 and the lower packages 401 of the first row X1' may be less than a minimum distance B21 between the third side 103 of the module substrate 100 and the lower packages 401 of the second row X2'. In the first group G11, the number of the lower packages 401 of the first row X1' may be equal to the number of the lower packages 401 of the second row X2'. In the first group G11, a maximum distance between the third side 103 of the module substrate 100 and the lower packages 401 of the first row X1' may be less than a maximum distance between the third side 103 of the module substrate 100 and the lower packages 401 of the second row X2'. Thus, in exemplary embodiments, the maximum signal path length between the first lower tabs 211 and the lower packages 401 of the first group G11 may be reduced.

The lower packages 401 of the second group G21 may be closer to the fourth side 104 of the module substrate 100 than to the third side 103 of the module substrate 100 when viewed in a plan view. In exemplary embodiments, the lower packages 401 of the second group G21 may be electrically connected to the second lower tabs 221 through the module substrate 100, and the lower packages 401 of the second group G21 are not electrically connected to the first and third lower tabs 211 and 231. In the lower packages 401 of the second group G21, a length of a signal path S21 (see FIG. 1H) between the lower package 401 of the first row X1' closest to the third side 103 and the second lower tab 221 connected thereto may correspond to a maximum signal path length. In exemplary embodiments, in the lower packages 401 of the second group G21, the lower packages 401 of the first row X1' may be shifted with respect to the lower packages 401 of the second row X2' in the third direction D3. For example, a minimum distance C11 between the fourth side 104 of the module substrate 100 and the lower packages 401 of the first row X1' may be less than a minimum distance C21 between the fourth side 104 of the module substrate 100 and the lower packages 401 of the second row X2'. Thus, in exemplary embodiments, the maximum signal path length between the second lower tabs 221 and the lower packages 401 of the second group G21 may be reduced.

In exemplary embodiments, the semiconductor package 310, the semiconductor device 320 and the passive element 600 are not disposed on the bottom surface 100b of the module substrate 100.

In exemplary embodiments, a total number of the upper packages 400 and the lower packages 401 may be 2n+A, where n is an integer equal to or greater than 1, and A is an integer equal to or greater than 0. Some of the upper and lower packages 400 and 401 may function as memory packages. For example, a total number of the upper and lower packages 400 and 401 functioning as the memory packages may be 2n. Others of the upper and lower packages 400 and 401 may function as preliminary memory packages which are disposed for cases in which the memory packages are not operated. For example, when the memory packages are activated, the preliminary memory packages may be deactivated. A total number of the preliminary memory packages may be A. However, the number and functions of the upper and lower packages 400 and 401 are not limited thereto.

Figure 1I:
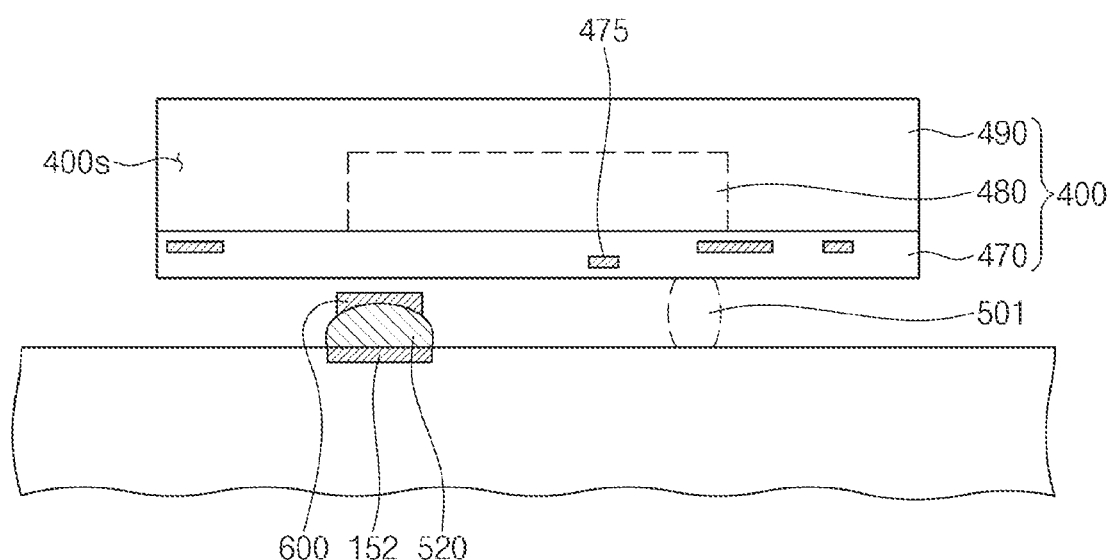
FIG. 1I is a cross-sectional view illustrating one of upper packages and a first passive element disposed in a semiconductor module according to exemplary embodiments of the present inventive concept.

FIG. 1I is a cross-sectional view illustrating one of upper packages and a first passive element disposed in a semiconductor module according to exemplary embodiments of the present inventive concept.

Hereinafter, for convenience of explanation, a singular upper package will be described. In addition, for convenience of explanation, a further description of components and technical features previously described may be omitted.

Referring to FIGS. 1E and 1I, the upper package 400 may include the upper substrate 470, the upper semiconductor chip 480, and the upper molding layer 490. The upper substrate 470 may include an insulating layer and metal patterns 475. The metal patterns 475 may be disposed in the insulating layer and may function as an electrical connection path. Some of the metal patterns 475 may be exposed at a sidewall of the upper substrate 470. The sidewall of the upper substrate 470 may correspond to a lower portion of a sidewall 400s of the upper package 400. The upper semiconductor chip 480 may be sealed by the upper molding layer 490, and thus, in exemplary embodiments, is not exposed at the sidewall 400s of the upper package 400. A sidewall of the upper molding layer 490 may correspond to an upper portion of the sidewall 400s of the upper package 400. The upper molding layer 490 may include, for example, an insulating polymer.

As described above, a portion of the first passive element 610 may overlap the upper package 400. In exemplary embodiments, the first passive element 610 may overlap the sidewall 400s of the upper package 400 when viewed in a plan view. The first passive element 610 may be disposed between the module substrate 100 and the upper substrate 470. The first passive element 610 may be spaced apart from the exposed portions of the metal patterns 475. For example, in exemplary embodiments, exposed surfaces of the metal patterns 475 do not overlap the first passive element 610 when viewed in a plan view. Thus, even if a minor error occurs in a process of manufacturing the semiconductor module 1, an electrical short may be prevented from occurring between the first passive element 610 and the exposed portions of the metal patterns 475. For example, in exemplary embodiments, one of the electrodes 601 and 602 of the first passive element 610 and/or one of the connection portions 510 and 520 are not in contact with the exposed surfaces of the metal patterns 475.

Figure 2:
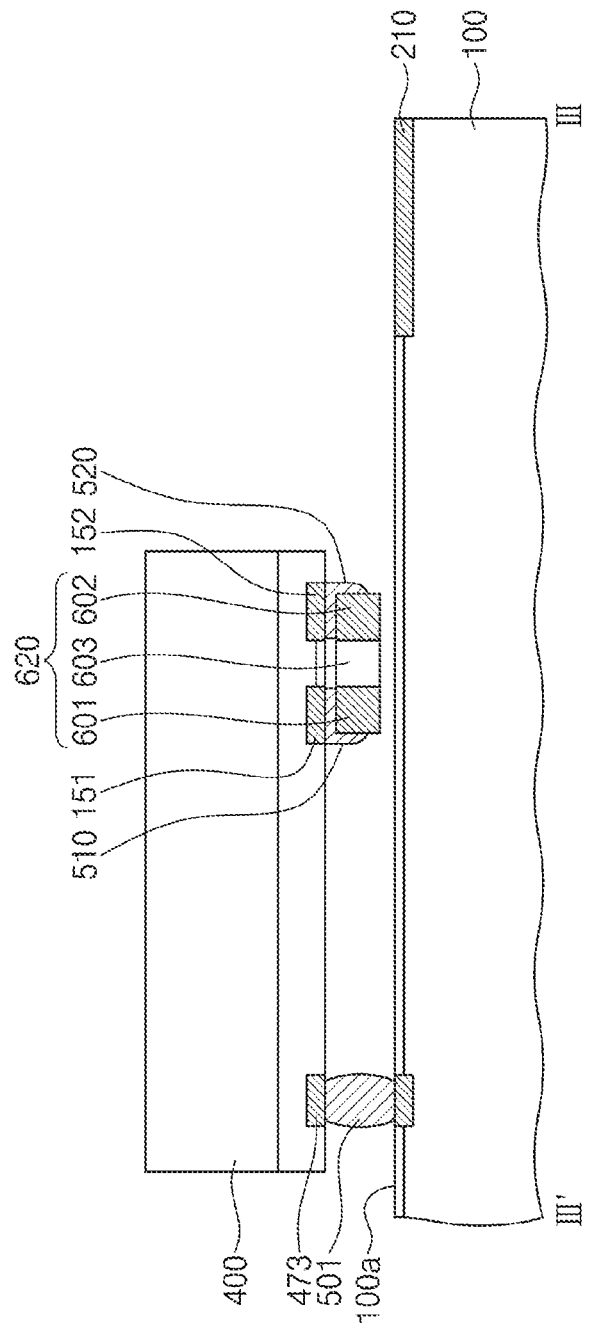
FIG. 2 is a cross-sectional view corresponding to line III-III' of FIG. 1D, and illustrates the mounting of a second passive element according to exemplary embodiments of the present inventive concept.

FIG. 2 is a cross-sectional view corresponding to line III-III' of FIG. 1D, and illustrates the mounting of a second passive element according to exemplary embodiments of the present inventive concept.

Hereinafter, for convenience of explanation, a singular upper package will be described. In addition, for convenience of explanation, a further description of components and technical features previously described may be omitted.

Referring to FIGS. 1A, 1D and 2, in exemplary embodiments, a second passive element 620 may overlap the upper package 400 when viewed in a plan view. However, unlike the exemplary embodiment of FIG. 1F, the second passive element 620 may be mounted on the bottom surface of the upper package 400, as shown in FIG. 2.

A conductive pad 473, a first pad 151 and a second pad 152 may be disposed on the bottom surface of the upper package 400. The conductive pad 473, the first pad 151 and the second pad 152 may include a conductive material such as a metal. The conductive pad 473 may be connected to the upper connection terminal 501.

The first and second pads 151 and 152 may be spaced apart from the conductive pad 473. A first connection portion 510 may be disposed between the first pad 151 and the first electrode 601 of the second passive element 620. A second connection portion 520 may be disposed between the second pad 152 and the second electrode 602 of the second passive element 620. The second passive element 620 may be electrically connected to the upper package 400 through the first and second connection portions 510 and 520. The second passive element 620 may be spaced apart from the top surface 100a of the module substrate 100. For example, as shown in FIG. 2, in exemplary embodiments, the second passive element 620 is disposed on the bottom surface of the upper package 400, and a space exists between the second passive element 620 and the top surface 100a of the module substrate 100.

Figure 3A:
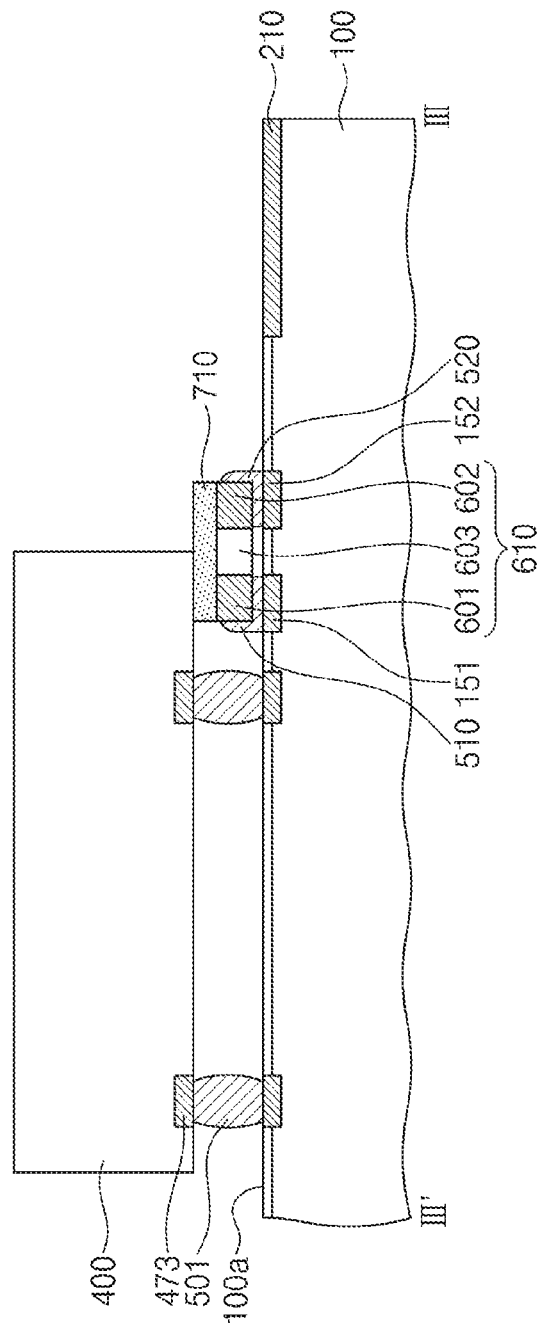
FIG. 3A is a cross-sectional view corresponding to line III-III' of FIG. 1D, and illustrates a semiconductor module according to exemplary embodiments of the present inventive concept.

FIG. 3A is a cross-sectional view corresponding to line III-III' of FIG. 1D, and illustrates a semiconductor module according to exemplary embodiments of the present inventive concept.

Figure 3B:
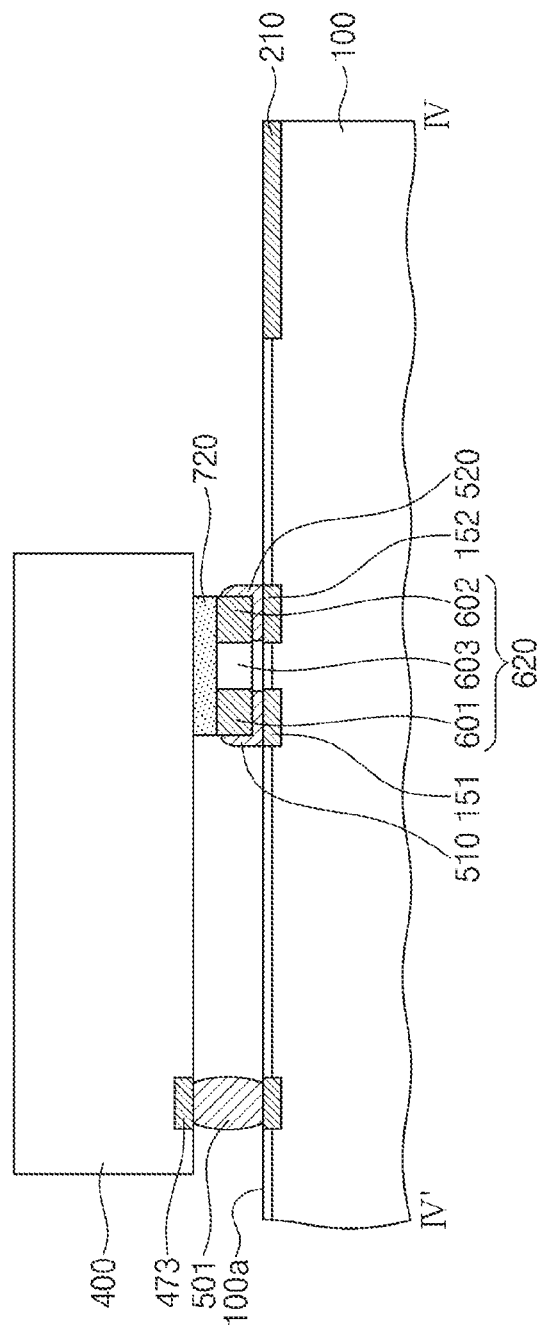
FIG. 3B is a cross-sectional view corresponding to line IV-IV' of FIG. 1D, and illustrates a semiconductor module according to exemplary embodiments of the present inventive concept.

FIG. 3B is a cross-sectional view corresponding to line IV-IV' of FIG. 1D, and illustrates a semiconductor module according to exemplary embodiments of the present inventive concept.

Hereinafter, for convenience of explanation, a singular upper package will be described. In addition, for convenience of explanation, a further description of components and technical features previously described may be omitted.

Referring to FIGS. 1A, 1D and 3A, in exemplary embodiments, a first support portion 710 may be disposed between the first passive element 610 and the upper package 400. The first support portion 710 may be in physical contact with the first passive element 610 and the upper package 400. The first support portion 710 may include an insulating material, and in exemplary embodiments, is not electrically connected to the first passive element 610 and the upper package 400. The configuration of the first support portion 710 and the first passive element 610 may prevent the upper package 400 from bending or warping.

Referring to FIGS. 1A, 1D and 3B, in exemplary embodiments, a second support portion 720 may be disposed between the second passive element 620 and the upper package 400. The second support portion 720 may be in physical contact with the second passive element 620 and the upper package 400. The second support portion 720 may include an insulating material, and in exemplary embodiments, is not electrically connected to the second passive element 620 and the upper package 400. The configuration of the second support portion 720 and the second passive element 620 may prevent the upper package 400 from bending or warping.

According to exemplary embodiments of the present inventive concept, at least a portion of a passive element may overlap one of the upper packages when viewed in a plan view. Further, the arrangement of the upper packages may be adjusted to reduce the lengths of the signal paths between tabs and the upper packages. Thus, the operating speed and reliability of the semiconductor module may be improved. In addition, the semiconductor module may have high capacity.

While the present inventive concept has been particularly shown and described with reference to the exemplary embodiments thereof, it will be understood by those skilled in the art that various changes in form and detail may be made therein without departing from the spirit and scope of the present inventive concept as defined by the following claims.

What is claimed is:

1. A semiconductor module, comprising:
   a module substrate having a first side extending in a first direction, and a second side opposite to the first side;
   a plurality of upper packages disposed on a top surface of the module substrate, and arranged in a plurality of rows extending in the first direction,
   wherein the upper packages of a first row belonging to the plurality of rows are arranged to be shifted with respect to the upper packages of a second row belonging to the plurality of rows in the first direction,
   wherein the module substrate comprises a first region disposed between the first side of the module substrate and the upper packages of the second row, a second region disposed between the upper packages of the first row and the upper packages of the second row, and a third region disposed between another side of the module substrate and an outermost upper package of the first row and between the another side and an outermost upper package of the second row;
   a first passive element comprising a first portion and a second portion,
   wherein the first portion of the first passive element is disposed between a bottom surface of one of the upper packages of the second row and the top surface of the module substrate, and the second portion of the first passive element is disposed in the first region and is not disposed between the bottom surface of the one of the upper packages of the second row and the top surface of the module substrate;
   a second passive element comprising a first portion and a second portion,
   wherein the first portion of the second passive element is disposed between a bottom surface of one of the upper packages of the first row and the top surface of the module substrate, and the second portion of the second passive element is disposed in the second region and is not disposed between the bottom surface of the one of the upper packages of the first row and the top surface of the module substrate; and
   a third passive element comprising a first portion and a second portion,
   wherein the first portion of the third passive element is disposed between a bottom surface of the outermost upper package of the first row and the top surface of the module substrate, and the second portion of the third passive element is disposed in the third region and is not disposed between the bottom surface of the outermost upper package of the first row and the top surface of the module substrate.

2. The semiconductor module of claim 1, further comprising:
   a plurality of tabs disposed on the top surface of the module substrate adjacent to the first side,
   wherein the first region is disposed between the tabs and the upper packages of the second row when viewed in a plan view, wherein the upper packages of the second row are closer to the tabs than the upper packages of the first row, and wherein the another side of the module substrate extends in a different direction than the first direction and is adjacent to the first side.

3. The semiconductor module of claim 2, wherein each of the upper packages of the first row has a long axis parallel to a second direction, wherein each of the upper packages of the second row has a long axis parallel to the first direction, wherein the upper packages of the second row are closer to the tabs than the upper packages of the first row, and wherein the second direction is substantially perpendicular to the first direction.

4. The semiconductor module of claim 1, further comprising:

a plurality of lower packages disposed on a bottom surface of the module substrate, and arranged in a plurality of additional rows extending in the first direction, wherein the lower packages of a first row belonging to the plurality of additional rows are arranged to be shifted with respect to the lower packages of a second row belonging to the plurality of additional rows in the first direction.

5. The semiconductor module of claim 1, wherein each of the upper packages comprises:

a package substrate;

a memory chip mounted on the package substrate; and a molding layer covering the memory chip on the package substrate.

6. The semiconductor module of claim 1, further comprising:

a connection portion disposed between the one of the upper packages of the second row and the first passive element, wherein the first passive element is connected to the one of the upper packages of the second row through the connection portion.

7. The semiconductor module of claim 2, wherein a minimum distance between the tabs and the upper packages is less than a minimum distance between the second side of the module substrate and the upper packages.

8. A semiconductor module, comprising:

a module substrate having a first side, a second side opposite to the first side, a third side adjacent to the first side, a fourth side opposite to the third side, and a first region;

a plurality of tabs disposed on a top surface of the module substrate adjacent to the first side;

a plurality of memory packages mounted on the top surface of the module substrate and arranged in a plurality of rows extending in a first direction; and a passive element comprising a first portion and a second portion, and mounted on the top surface of the module substrate, wherein the first side of the module substrate extends in the first direction, wherein the memory packages comprise:

a plurality of first packages disposed in a first row belonging to the plurality of rows in a plan view; and a plurality of second packages disposed in a second row belonging to the plurality of rows in the plan view, wherein the second packages are closer to the tabs than the first packages, wherein the first region is disposed between the tabs and the second packages, when viewed in the plan view, and wherein the first portion of the passive element is disposed between a bottom surface of one of the second packages and the top surface of the module substrate, and the second portion of the passive element is disposed in the first region and is not disposed between the bottom surface of the one of the second packages and the top surface of the module substrate.

9. The semiconductor module of claim 7, wherein some of the memory packages belong to a first group and others of the memory packages belong to a second group, and the memory packages of the second group are closer to the fourth side of the module substrate than the memory packages of the first group, wherein the tabs comprise:

a plurality of first tabs adjacent to the third side; and a plurality of second tabs closer to the fourth side than the first tabs, wherein the first tabs are electrically connected to the memory packages of the first group, and the second tabs are electrically connected to the memory packages of the second group.

10. The semiconductor module of claim 9, wherein the first packages are shifted with respect to the second packages in the first direction in the first group, and the first packages are shifted with respect to the second packages in an opposite direction to the first direction in the second group.

11. The semiconductor module of claim 10, further comprising:

a logic package mounted on the top surface of the module substrate, wherein the logic package is disposed between the memory packages of the first group and the memory packages of the second group when viewed in the plan view.

12. The semiconductor module of claim 11, wherein the tabs further comprise:

a third tab disposed between the first tabs and the second tabs, wherein the third tab is electrically connected to the logic package.

13. The semiconductor module of claim 11, further comprising:

a semiconductor device mounted on the top surface of the module substrate, wherein the semiconductor device comprises a serial presence detection (SPD) chip.

14. The semiconductor module of claim 7, wherein a minimum distance between the third side and the first packages is less than a minimum distance between the third side and the second packages, wherein a minimum distance between the fourth side and the first packages is less than a minimum distance between the fourth side and the second packages.

15. A semiconductor module, comprising:

a module substrate having a first side extending in a first direction and a second side extending in the first direction;

a plurality of tabs disposed on a top surface of the module substrate adjacent to the first side;

a plurality of memory packages mounted on the top surface of the module substrate and arranged in a plurality of rows extending in the first direction; and a passive element comprising a first portion and a second portion, and mounted on the top surface of the module substrate, wherein the memory packages comprise:
a plurality of first packages disposed in a first row belonging to the plurality of rows in a plan view; and
a plurality of second packages disposed in a second row belonging to the plurality of rows in the plan view,
wherein the second packages are closer to the tabs than the first packages, each of the first packages has a long axis parallel to a second direction that is substantially perpendicular to the first direction, and each of the second packages has a long axis parallel to the first direction,
wherein a region of the module substrate is disposed between the first packages and the second packages, when viewed in the plan view, and
wherein the first portion of the passive element is disposed between a bottom surface of one of the first packages and the top surface of the module substrate, and the second portion of the passive element is disposed in the region and is not disposed between the bottom surface of the one of the first packages and the top surface of the module substrate.

16. The semiconductor module of claim 15,
wherein the module substrate further has a third side adjacent to the first side, and a fourth side opposite to the third side, and
wherein a minimum distance between the third side and the first packages is less than a minimum distance between the third side and the second packages.

17. The semiconductor module of claim 16, wherein a minimum distance between the fourth side and the first packages is less than a minimum distance between the fourth side and the second packages.

18. The semiconductor module of claim 15,
wherein a minimum distance between the tabs and the memory packages is less than a minimum distance between the second side of the module substrate and the memory packages.

* * * * *